THIN-FILM RC CIRCUITS ON SINGLE SUBSTRATE

Original Filed Oct. 23, 1962

FABRICATION OF EXEMPLARY RC CIRCUIT UTILIZING 3-LAYERED FILMS

INVENTORS
FRANCIS L. MURRAY, JR.
THOMAS V. SIKINA

BY D. P. Pressman

ATTORNEY

THIN-FILM RC CIRCUITS ON SINGLE SUBSTRATE

Original Filed Oct. 23, 1962 3 Sheets-Sheet 2

ALTERNATIVE FABRICATION OF EXEMPLARY RC CIRCUIT USING 4 LAYERED FILMS

INVENTORS
FRANCIS L. MURRAY JR.
THOMAS V. SIKINA
BY
D. P. Freedman
ATTORNEY

SCHEMATIC DIAGRAM OF EXEMPLARY RC CIRCUIT OF FIG. 1 AND FIG. 2.

FREQUENCY v. "Q" CHARACTERISTIC FOR THIN FILM CAPACITORS

INVENTORS
FRANCIS L. MURRAY, JR.
THOMAS V. SIKINA
BY
D R Pressman
ATTORNEY

United States Patent Office 3,386,011

Patented May 28, 1968

3,386,011

THIN-FILM RC CIRCUITS ON SINGLE SUBSTRATE

Francis L. Murray, Jr., Riverside, Calif., and Thomas V. Sikina, Baltimore, Md., assignors to Philco-Ford Corporation, a corporation of Delaware Original application Oct. 23, 1962, Ser. No. 232,539, now Patent No. 3,256,588, dated June 21, 1966. Divided and this application Apr. 28, 1966, Ser. No. 546,084

8 Claims. (Cl. 317—101)

ABSTRACT OF THE DISCLOSURE

Thin-film RC circuits on single substrate employing elongated film resistor with widened end portions and capacitor on widened end portion comprising metal bottom electrode, insulating layer, and metal top electrode, with bottom electrode also serving as one contact of resistor.

This application is a division of applicants' prior copending application, Ser. No. 232,539, filed Oct. 23, 1962, now Patent 3,256,588, granted June 21, 1966.

Contemporaneous activity in the field of microminiaturization of electronic components and circuitry has precipitated numerous advances and accomplishments worthy of note. This invention relates to one of the same, viz., the construction, via a simple and economical process, of a microminiature array of close tolerance resistors and high-Q capacitors on a single substrate, using multiple layers of thin films.

Previous resistor-capacitor (RC) thin film circuitry was constructed by anodizing, on a common substrate, a single metallic film at various voltages—one voltage for capacitors and one or more different voltages for resistors. Disadvantages of this monometal approach, discussed in copending application of John G. Simmon, Ser. No. 122,526, filed July 7, 1961, and assigned to the present assignee, include:

(1) A circular plate composed of microcircuits having resistors made from the same material as capacitors must be fabricated so that each circuit is anodized and monitored separately to control resistor tolerances, (2) The monometal capacitors have relatively poor frequency v. Q characteristics, (3) A costly and complex fabrication process requiring interruption of vacua is required, and (4) Relative difficulty of bonding external connections to the circuits is found.

Utilization of the process of the present invention obviates the aforementioned disadvantages of the monometal scheme. With the present process the resistance values for an entire circuit plate of 50 or 60 microcircuits can be controlled to ±7% of a given resistance on the initial deposition, which is reduced to ±5% after heat treatment. The circuit capacitors have Q's of 50 to 100 at 3 mc. In addition, the process is highly compatible since the basic circuit can be constructed without breaking vacuum. Leads are easily attached since gold conducting areas are provided.

*Objects*

The objects of the present invention thus include: (1) the provision of improved RC circuits using thin film techniques, and (2) the provision of multiple RC circuits having close tolerances and high Q's in a compatible, economical fashion. Other objects and advantages of the invention will become apparent from a consideration of the following summary and description thereof.

*Summary*

In accordance with the preferred embodiment of the present invention thin film RC circuits are formed on a substrate using an initial assembly of three sequentially deposited metallic films. Photolithographic techniques are used to pattern resistor areas from the first film, contact conductors areas and capacitor electrodes from the second film, and capacitor areas from the third film. The metallic capacitor areas are made dielectric by anodization, and counter electrode contacts are evaporated thereover. Almost any given RC circuit can be reproduced in thin film form using the above techniques.

*Drawings*

FIG. 1.—PREFERRED EMBODIMENT

Figure 3:
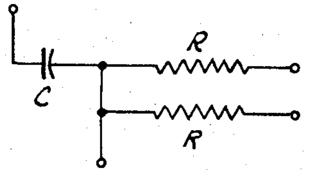
FIG. 3 shows a schematic diagram of the RC circuit of FIGS. 1 and 2.

Fabrication of the exemplary RC circuit shown in FIG. 3 is begun, according to the preferred embodiment of the invention, with the structure shown in FIG. 1A. A glass substrate is covered by a first layer of tantalum (Ta 1) an intermediate layer of gold (Au 1), and a second layer of tantalum (Ta 2). This initial structure may be formed without breaking vacuum in a sequential sputtering process, to be discussed infra. Using photolithographic techniques, most of the top layer of tantalum in the structure of FIG. 1A is etched away to leave the section thereof shown in FIG. 1B, which section will ultimately form the capacitor dielectric. Next the intermediate gold layer is selectively etched away to leave the four areas shown in FIG. 1C, which form the contacts for the circuit plate. The bottom layer of tantalum is now etched away to leave the two resistor strips shown in FIG. 1D. Next the block of Ta 2 is anodized (the rest of the circuit being masked) to grow an oxide ($Ta_2O_5$) thereon. This oxide will form the capacitor dielectric. Then external leads (not shown) are ultrasonically welded to the gold contact areas. Finally a counter electrode of chromium covered with gold is evaporated over most of the tantalum pentoxide dielectric as shown. This counter electrode also forms a bridge to the upper left gold contact areas as shown to yield the RC circuit of FIG. 3. The external leads may alternatively be attached after the counter electrodes are evaporated if it is found that the leads interfere with the formation of the counter electrode.

FIG. 2.—ALTERNATIVE MODE OF FABRICATION

The exemplary RC circuit of FIG. 3 may be fabricated in an alternative manner by using the initial structure shown in FIG. 2A. Said structure may be formed in the manner as the circuit of FIG. 1A, except that a second layer of gold, Au 2, is sputtered on top of Ta 2. The top three layers, Au 2, Ta 2, and Au 1 are then selectively etched away to leave the four contact areas shown in FIG. 2B. Next the bottom layer of tantalum is etched to form the resistor strips shown in FIG. 2C. Part of the lower lefthand patch of Au 2 is next removed to expose a section of Ta 2 as shown. In step C the part of this Ta 2 within the dotted lines is anodized (rest of the circuit being masked) to grow an oxide of $Ta_2O_5$ thereon which will form the capacitor dielectric. This oxide may grow to a level above the Au 2 film as shown in the side views of FIGS. 2D and 2F. Finally a counter electrode of Cr covered by Au is evaporated over most of the $Ta_2O_5$ dielectric as shown. As before the counter electrode also forms a bridge to the upper left gold contact area to yield the RC circuit of FIG. 3.

*Details of fabrication*

Figure 1:
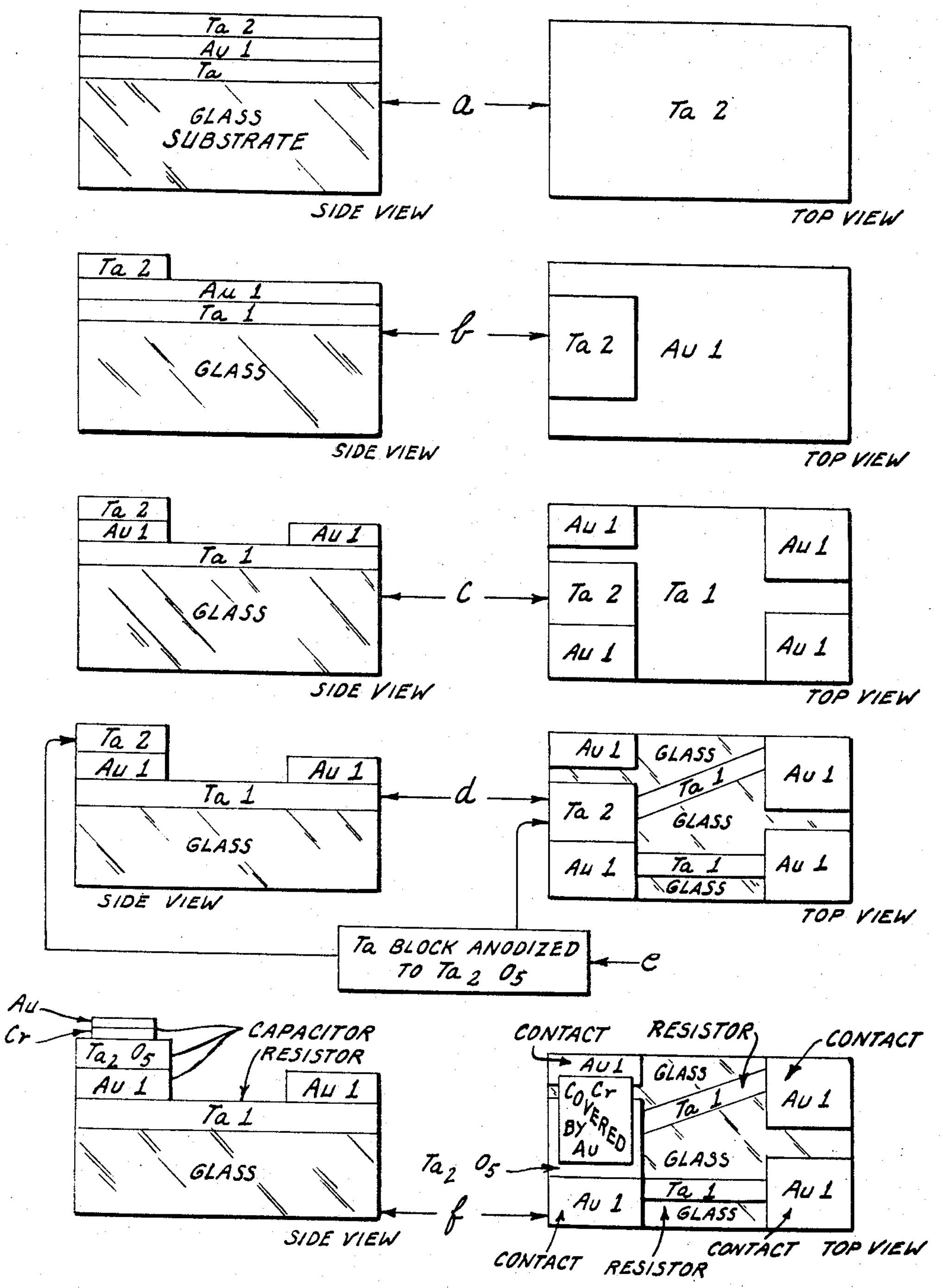
FIG. 1 depicts various stages in the fabrication of an exemplary RC thin film circuit according to the preferred embodiment of the invention.
Figure 2:
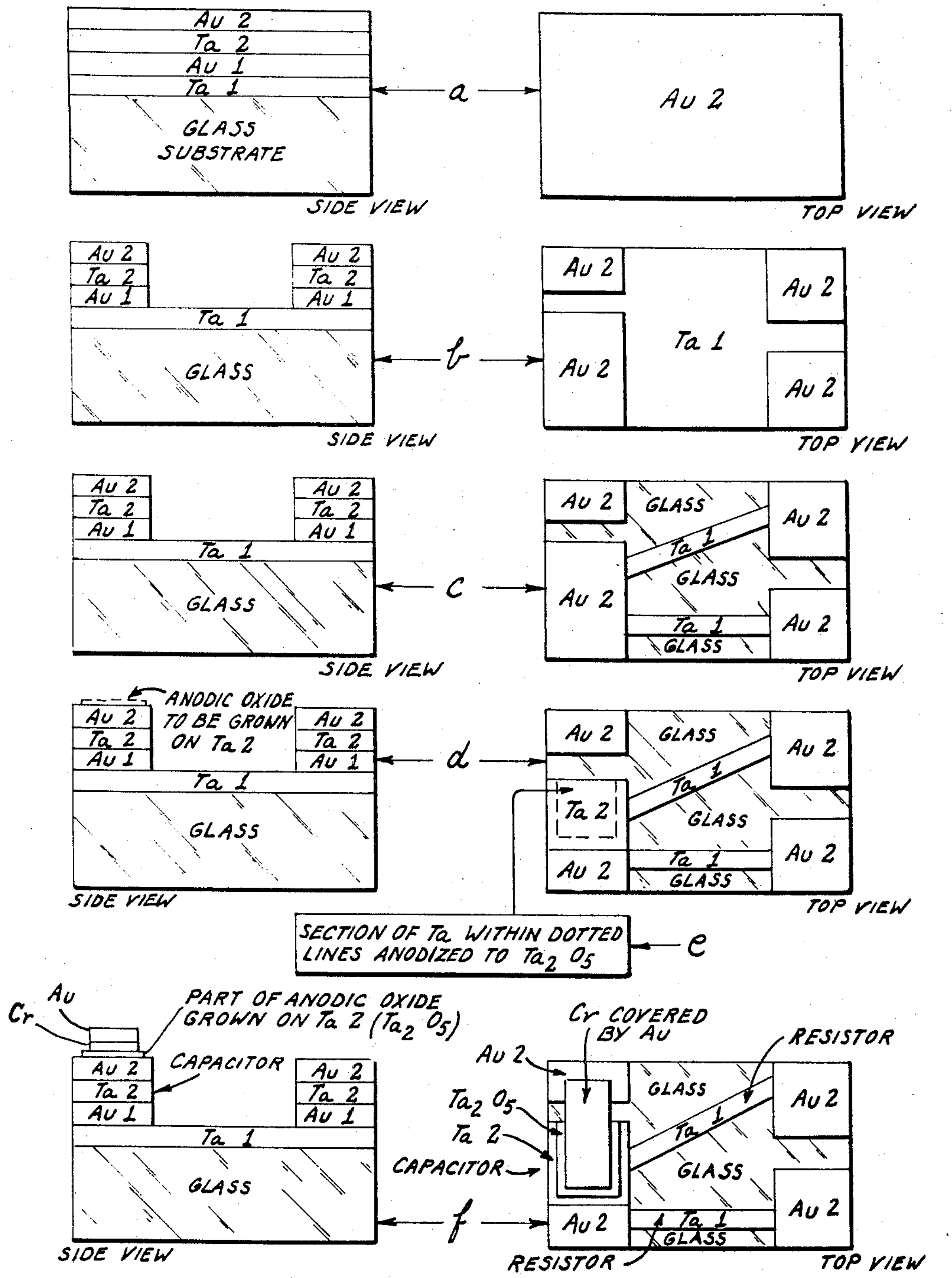
FIG. 2 depicts an alternative mode of fabrication of the exemplary RC circuit of FIG. 1.

It should be noted parenthetically that the vertical dimensions of the films in the diagrams of FIGS. 1 and 2 are extremely exaggerated. In actuality the thickness and length of the glass substrate may range approximately from 10 to 100 mils and 200 to 1000 mils, respectively.

The multi-layer starting assemblies of FIGS. 1 and 2 may be formed by the sputtering process, in which a single vacuum system having Au and Ta cathodes and a rotating substrate holder will permit the deposition of alternate layers of different metals without breaking vacuum. Further details of this sequential sputtering process are discussed in the aforementioned Simmons application. Other processes, such as vacuum evaporation, may also be used to form the starting assemblies. Further details of the sputtering and vacuum evaporation processes per se may be gleaned by reference to Patent No. 2,993,266, granted to R. W. Berry on July 25, 1961.

The first layer deposited on the glass substrate (Ta 1) is made sufficiently thin (e.g. 375 A.) to provide a film of high resistivity so that it will be suitable for small area resistors.

The second layer (Au) is made relatively thick (e.g., 2000 A.) to provide low resistance conductor paths and good bonding areas for external connections and active elements. This layer also serves as a low resistivity base electrode for the anodized Ta dielectric, thus resulting in assembly capacitors having high-Q's.

The third layer deposited (Ta 2) is sufficiently thick (e.g., 2500 A.) to permit standard electrochemical anodizing to obtain a thick layer of $Ta_2O_5$ which serves as the dielectric for the capacitors.

The capacitor counter electrodes may be desirably evaporated over the anodized tantalum through metal masks, and may be composed of a layer of chromium followed by a layer of gold. However, the counter electrodes may alternatively be made from gold alone, aluminum alone, or any other suitable metal as is well known to those skilled in the art.

It has been observed that the counter electrode, which also forms a connection to the upper lefthand Au contact, does not form a bridge to the Au 1 film (below Ta 2) to short out the capacitor. It is theorized, but not assumed, that this is due either to: (1) the edges of both Ta layers (Ta 1 and Ta 2) may grow a projecting oxide during anodization to keep the evaporated counter electrode from reaching the Au 1 film, or (2) the counter electrode may not completely fill the gap during evaporation so that the walls and Au 1 are not contacted, or (3) during anodization any potentially deleterious gold may be removed when adjacent Ta atoms become oxidized.

In practice 50 or 60 different microcircuits of the type disclosed herein may be simultaneously produced on a single large circuit plate. Resistance values can be controlled to $\pm 7\%$ of a given ohms/square on the initial deposition, which can be reduced to $\pm 5\%$ after heat treatment. The values of individual resistors can also be adjusted to a closer tolerance when required. Details concerning the adjustment technique for precision resistor fabrication which is applicable to the instant invention are disclosed in the copending application of Mauro J. Walker, Ser. No. 214,382, filed Aug. 2, 1962, and assigned to the present assignee.

Figure 4:
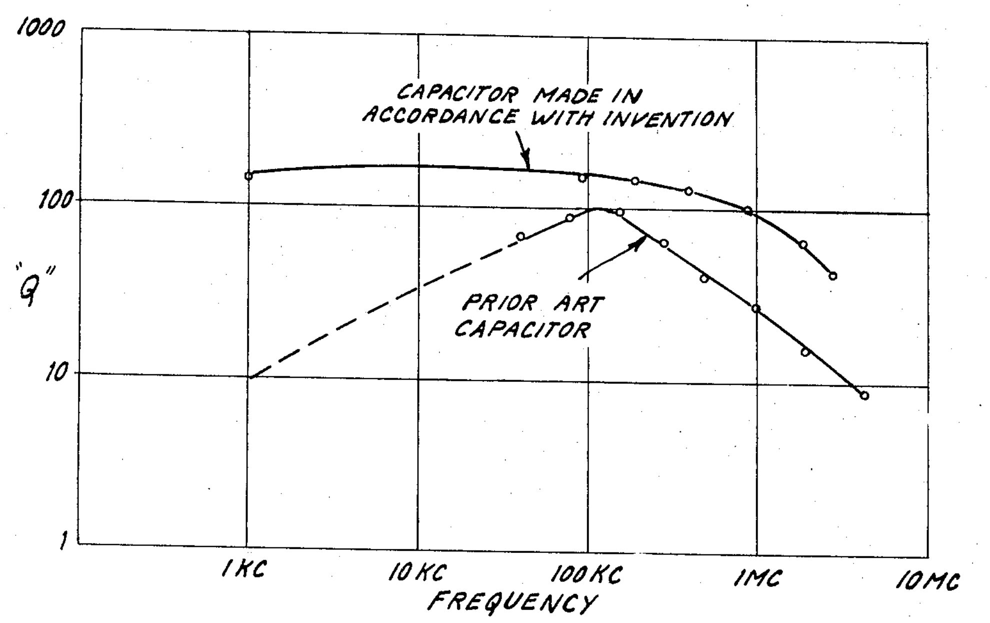
FIG. 4 shows curves relevent to the invention.

The Q v. frequency characteristics of the capacitors of the present invention are superior to those produced according to the process of the aforementioned Simmons application because of the low series resistance provided by the underlying gold. E.g., Q's of 50 to 100 have been obtained at 3 mc. with capacitors made according to the invention. FIG. 4 shows a representative comparison with Q v. frequency characteristic of a prior art capacitor made by anodizing tantalum on a substrate and evaporating a counter electrode thereover.

Circuits made in accordance with the present invention are also susceptible of interconnection with transistor elements according to the technique set forth in the copending application of Thomas V. Sikina and John A. Hall, Jr., Ser. No. 229,329, filed Oct. 9, 1962, and also assigned to the assignee of the present invention.

The process of the invention has been specifically described above utilizing tantalum and gold as the circiut metals. Tantalum is preferred because it can be deposited in stable films of high sheet resistivity, has a low thermal coefficient of resistivity, is corrosion resistant, and is an excellent valve metal and hence can be anodized to form good capacitors. Gold is preferred because of its low sheet resistivity and excellent corrosion resistance. However other metals can be used in lieu of these two metals. E.g., tungsten, titanium, chromium, molybdenum, and Nichrome may be used in place of tantalum; in place of gold, may be used platinum, rhodium, palladium, iridium, silver, nickel, aluminum, and copper.

The specific RC circuit of FIG. 3 whose fabrication was discussed herein is exemplary only. Almost any given RC circuit configuration can be produced according to the invention, and hence the circuit shown is nowise to be considered limiting or indicative of the scope of the invention. The same applies to other specificities of the disclosure. Accordingly, the invention is defined only by the appended claims.

We claim:

1. A thin-film resistance-capacitance circuit, comprising, in combination;

(a) an electrically insulating substrate having at least on substantially flat surface, (b) a resistor comprising a first film of a metallic substance having a relatively high sheet resistivity on said surface, said first film being patterned to include at least one relatively narrow portion and at least two relatively wide portions at spaced locations on said relatively narrow portion, (c) a second film of a metallic substance having a relatively low sheet resistivity and comprising at least two separated portions, each on a respective one of said wide portions of said first film, said two portions of said second film thereby forming contact areas for said resistor, (d) a third film including an insulating layer on one of said two portions of said second film, said one portion of said second film thereby forming a capacitor bottom electrode, and said third film thereby forming a capacitor dielectric, and (e) a fourth film of a metallic substance having a relatively low sheet resistivity on said third film, said fourth film thereby forming a capacitor top electrode.

2. The combination of claim 1 wherein said third film is of the same substance as said first film, said insulating layer being an oxide of said third film.

3. The combination of claim 1 wherein said first film and said third film are tantalum, said second film is gold, and said fourth film is at least in part gold.

4. The combination of claim 3 wherein said fourth film comprises a layer of chromium covered by a layer of gold.

5. The combination of claim 1 wherein said substrate is glass.

6. The combination of claim 1 wherein said first film and said third film consist of a material selected from the group consisting of tantalum, tungsten, titanium, chromium, molybdenum, and Nichrome, and wherein said fourth film consists of a material selected from the group consisting of gold, platinum, rhodium, palladium, iridium, silver, nickel, aluminum, and copper.

7. The combination of claim 1 wherein said insulating layer comprises a part of the surface of said wide portion of said third film, said part being oxidized, and wherein said fourth film is deposited on a portion of said oxidized part of said third film.

8. The combination of claim 1 wherein said insulating layer comprises said entire wide portion of said third film, said entire wide portion being oxidized, and wherein said fourth film is deposited on a part of the surface of said wide portion of said third film.

References Cited

UNITED STATES PATENTS

| | | | |
|---|---|---|---|
| 3,200,326 | 10/1965 | Pritikin et al. | 317—258 |
| 3,205,555 | 9/1965 | Balde et al. | 317—101 |
| 3,220,938 | 11/1965 | McLean et al. | 317—235 |

ROBERT K. SCHAEFER, *Primary Examnier.*

D. SMITH, *Assistant Examiner.*